Aug. 18, 1970 J. J. KARDASH 3,524,992
TRANSISTOR LOGIC CIRCUIT
Filed Aug. 17, 1967
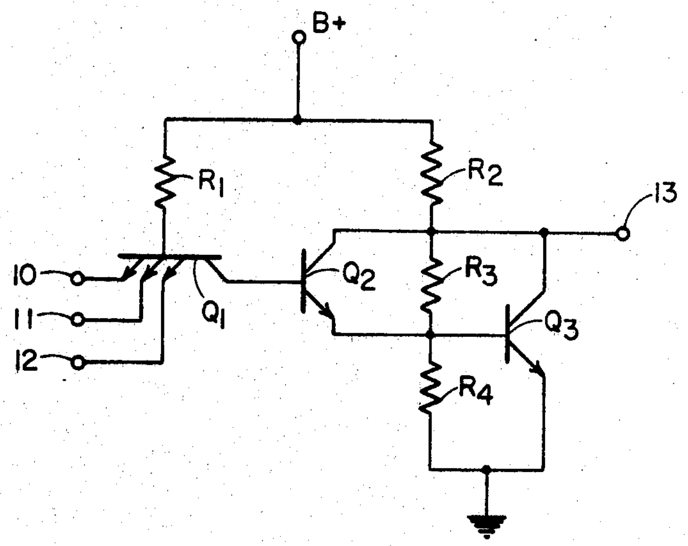
INVENTOR.
JOHN J. KARDASH
BY David M. Keay
AGENT.

United States Patent Office 3,524,992
Patented Aug. 18, 1970

3,524,992
TRANSISTOR LOGIC CIRCUIT

John J. Kardash, Acton, Mass., assignor to Sylvania Electric Products Inc., a corporation of Delaware Filed Aug. 17, 1967, Ser. No. 661,452
Int. Cl. H03k *19/36*
U.S. Cl. 307—215 9 Claims

ABSTRACT OF THE DISCLOSURE

Non-saturating NAND logic circuit employing a voltage divider to bias an output transistor in a low conducting condition. A coupling transistor, which is connected across portions of the voltage divider and the output transistor, biases the output transistor to high conduction while preventing it from saturating in response to appropriate signal conditions at the input to the circuit.

BACKGROUND OF THE INVENTION

This invention relates to logic circuits. More particularly, it is concerned with high-speed digital logic circuits employing transistors.

Various types of digital logic circuits have been developed for fabrication as monolithic integrated circuit networks. Of these, the so-called transistor-transistor logic type (TTL) has become widely accepted because of the availability of certain circuits having favorable switching speeds, power dissipation, immunity to noise, fan-out (the number of succeeding logic circuits which can be operated with parallel input connections to the output connection of a given logic circuit), and capacitive load driving capability.

Recently, there has been impetus to produce several logic circuits together with their electrical interconnections to provide a complete subsystem in a single die of semiconductor material. Combining the several logic circuits of a subsystem in a single die of semiconductor material has been designated as large scale integration (LSI). For large scale integration it is desirable to employ individual logic circuits which require few components taking up only a small portion of a semiconductor die. It is also desirable that the circuits posses the favorable characteristics of known transistor-transistor logic circuits.

SUMMARY OF THE INVENTION

The logic circuit according to the invention employs a voltage divider of three resistances connected in series between first and second sources of reference potential. A first transistor means having an input connection is connected across the second or intermediate resistance of the voltage divider. This transistor means is operable in a first conduction condition when a first signal condition is present at its input connection and is operable in a second conduction condition when a second signal condition is present at its input connection.

The logic circuit also includes a second transistor means having a pair of output terminals which are connected across the second and third resistances of the voltage divider. The second transistor means has an input connection which is connected to the juncture between the second and third resistances and thus to the first transistor means. The second transistor means is operable in a first conduction condition when the first transistor means is in the first conduction condition and is operable in a second conduction condition when the first transistor means is in the second conduction condition. The conduction condition of the second transistor means determines the output signal condition of the logic circuit.

BRIEF DESCRIPTION OF THE DRAWING

Various objects, features, and advantages of the logic circuit of the invention together with its mode of operation will be apparent from the following detailed discussion and the accompanying drawing wherein the single figure is a schematic circuit diagram of a NAND logic circuit according to the invention.

DETAILED DESCRIPTION OF THE INVENTNION

The NAND circuit shown in the figure includes a multiple-emitter NPN input transistor $Q_1$ having three emitters with three input terminals 10, 11, and 12 each connected to an emitter. The base of the input tarnsistor $Q_1$ is connected through a resistance $R_1$ to a voltage source B+. The collector of the input transistor $Q_1$ is connected directly to the base of an NPN coupling transistor $Q_2$.

Three resistances $R_2$, $R_3$, and $R_4$ are connected in series between the B+ voltage source and ground to provide a voltage divider. Although the second or intermediate resistance $R_3$ of the voltage divider is indicated in the figure by a standard resistor symbol, the resistance may be provided by one or more diodes connected to operate in the forward biased mode. The coupling transistor $Q_2$ is connected across the second resistance $R_3$. Its collector is connected directly to the juncture between the first and second resistances $R_2$ and $R_3$ and its emitter is connected directly to the juncture between the second and third resistances $R_3$ and $R_4$.

An NPN output transistor $Q_3$ has its base connected directly to the juncture between the second and third resistances $R_3$ and $R_4$. Its emitter is connected directly to ground and its collector is connected directly to the juncture between the first and second resistances $R_2$ and $R_3$ of the voltage divider. The collector of the output transistor $Q_3$ is also connected directly to the output terminal 13.

When a relatively low level voltage condition is present at one or more of the three input terminals 10, 11, and 12, current flows from the B+ voltage source through the base resistance $R_1$ and across the forward biased base-emitter junctions of the input transistor $Q_1$. The greatest voltage drop occurs across the resistance $R_1$ establishing a low voltage at the base of the input transistor $Q_1$. Under these conditions, although transistor $Q_1$ is operating in saturation, the voltage at its collector is low, and coupling transistor $Q_2$ is biased in a substantially nonconducting condition.

Current flow from the B+ voltage source to ground through the voltage divider of resistances $R_2$, $R_3$, and $R_4$ establishes a voltage at the base of output transistor $Q_3$ which is sufficiently high to forward bias the base-emitter junction of that transistor and cause the transistor to operate in a low conducting condition. Since the output transistor $Q_3$ is conducting, current from the B+ voltage source flows through the resistance $R_2$ and then divides into two paths to flow to ground through resistances $R_3$ and $R_4$ and also through the output transistor $Q_3$, which is connected across resistances $R_3$ and $R_4$.

The voltage at the base of the output transistor $Q_3$ is prevented from going below the level necessary to hold the transistor in conduction since any tendency of the voltage at the base of the transistor to decrease reduces current flow through the transistor thus increasing current flow through the resistances $R_3$ and $R_4$ and consequently tending to raise the voltage at the base of the transistor $Q_3$. The resistance values may preferably be chosen so that the current divides approximately equally between the two paths and the output transistor $Q_3$ is in low conduction. Since the current flow through the output transistor $Q_3$ is low, a relatively high voltage condition is established at the output terminal 13.

The voltage established at the base of the coupling transistor $Q_2$ by the conditions at the input transistor $Q_1$ as previously explained is almost equal to that established at the emitter of transistor $Q_2$ by current flow through resistances $R_2$, $R_3$, and $R_4$ and the output transistor $Q_3$. Therefore, transistor $Q_2$ is biased in a substantially non-conducting condition and has no affect on the output transistor $Q_3$. Under these conditions the circuit may be considered "off" with the output signal at a relatively high voltage level.

While a low voltage level condition is present at one or more of the input terminals 10, 11, and 12, the signal at the output terminal 13 remains at the relatively high voltage level. When a positive signal condition, such as may be produced at the output of a similar logic circuit in the "off" condition, is present at all three input terminals 10, 11, and 12, the base-emitter junctions of the input transistor $Q_1$ become reverse biased reducing current flow through the base resistance $R_1$. The voltage at the base of input transistor $Q_1$ and also at its collector increases. The increased voltage at the base of coupling transistor $Q_2$ forward biases the base-emitter junction of that transistor causing it to conduct.

Current flows across the base-emitter junction of the coupling transistor $Q_2$ and into the base of the output transistor $Q_3$. Since the base-emitter junction of transistor $Q_3$ has already been forward biased in its previous low conducting condition, that transistor responds very rapidly to provide full current flow in a very short period of time. Both transistors $Q_2$ and $Q_3$ operate in high conducting conditions. Transistor $Q_2$ operates in saturation. Output transistor $Q_3$, however, is held out of saturation by the voltage drop between the collector and emitter of transistor $Q_2$ which establishes the collector-to-base voltage of the output transistor $Q_3$. Although transistor $Q_3$ is not saturated, current flow through it is heavy and, in effect, transistor $Q_3$ provides a low impedance between the output terminal 13 and ground, thus establishing a relatively low voltage condition at the output terminal. Under these conditions, the circuit may be considered "on."

When the signal condition at one or more of the input terminals 10, 11, and 12 is changed to the low level voltage, as may be produced at the output of a similar logic circuit in the "on" condition, a base-emitter junction of the input transistor $Q_1$ is forward biased. Under these conditions, as explained previously, the voltage at the collector is reduced thus biasing the base of the coupling transistor $Q_2$ so as to cause transistor $Q_2$ to become substantially non-conducting. As coupling transistor $Q_2$ is restored to the non-conducting condition, current flow into the base of the output transistor $Q_3$ is reduced and, therefore, current through the transistor $Q_3$ is reduced. Transistor $Q_3$ is restored to the low conducting condition established by the resistances $R_2$, $R_3$, and $R_4$ of the voltage divider. The voltage at the output terminal 13 is thus restored to its previous relatively high level and the circuit is in the "off" condition.

The turning "off" action takes place rapidly. The stored charge in the base region of the coupling transistor $Q_2$, which had been operating in satuation, is rapidly drained through the collector circuit of the input transistor $Q_1$. Since the output transistor $Q_3$ was not saturated, that transistor very rapidly returns to its previous low conducting condition.

The NAND logic circuit according to the invention as described has desirable characteristics as compared with known TTL logic circuits, including fast switching speeds, low power dissipation, and high noise immunity. The circuit employs only three transistors of the same conductivity type and four resistance elements and, therefore, occupies very little space when formed as a monolithic integrated circuit network in a semiconductor die.

The circuit can be employed as a module providing a basic logic function, and circuits may be combined to provide other logic functions. For example, two of the circuits as shown may have their output terminals connected directly to each other to perform the logical AND-OR-INVERT function. Several circuits may be appropriately interconnected so as to form flip-flop circuits of various types. Thus, a plurality of the circuits in a single semiconductor die may be appropriately interconnected by a suitable metallization pattern to form a complete subsystem. Driving circuits may be included in the output stages of the subsystem in order to provide greater driving power at the output terminals which must be connected by conductive leads to other subsystems in other semiconductor dice.

While there has been shown and described what is considered a preferred embodiment of the present invention, it will be obvious to those skilled in the art that various changes and modifications may be made therein without departing from the invention as defined in the appended claims.

What is claimed is:

1. A logic circuit including in combination:

first, second, and third resistances connected in series between first and second sources of reference potential;

first transistor means connected across the second resistance and having an input connection, said first transistor means being operable in a first conduction condition when a first signal condition is present at said input connection and being operable in a second conduction condition when a second signal condition is present at said input connection; and second transistor means having a pair of output terminals connected across the second and third resistances and having an input connection connected to the juncture between the second and third resistances, said second transistor means being operable in a first conduction condition when the first transistor means is in the first conduction condition and being operable in a second conduction condition when the first transistor means is in the second conduction condition.

2. A logic circuit in accordance with claim 1 wherein:

said first transistor means includes a first transistor having its collector connected to the juncture between the first and second resistances, its emitter connected to the juncture between the second and third resistances, and its base connected to the input connection; and said second transistor means includes a second transistor having its collector connected to the juncture between the first and second resistances, its emitter connected to the second source of reference potential, and its base connected to the juncture between the second and third resistances.

3. A logic circuit in accordance with claim 2 wherein:

said first transistor is biased to a substantially non-conducting condition when said first signal condition is present at the emitter, and is biased to a high conducting condition when said second signal condition is present at the emitter; and said second transistor is biased to a low conducting condition when said first transistor is in the non-conducting condition, and is biased to a high conducting condition when said first transistor is in a high conducting condition.

4. A logic circuit including in combination:

first transistor means;

input means connected to said first transistor means and operable to bias the first transistor means in a first conduction condition when a first signal condition is present at the input thereto, and operable to bias the first transistor means in a second conduction condition when a second signal condition is present at the input thereto;

second transistor means connected to said first transistor means; and circuit means including first, second, and third resistances connected in series between first and second sources of reference potential, said circuit means being connected to said second transistor means and operable to bias the second transistor means in a first conduction condition when the first transistor means is in the first conduction condition;

said first transistor means being operable to bias the second transistor means to a second conduction condition when the first transistor means is in the second conduction condition; wherein said first transistor means includes a first transistor having its base connected to the input means, its collector connected to the juncture between the first and second resistances, and its emitter connected to the juncture between the second and third resistances; and said second transistor means includes a second transistor having its base connected to the juncture between the second and third resistances, its emitter connected to the second source of reference potential, and its collector connected to the juncture between the first and second resistances.

5. A logic circuit in accordance with claim 4 wherein:

said input means is operable to bias the first transistor to a substantially non-conducting condition when the first signal condition is present at the input thereto, and operable to bias the first transistor to a high conducting condition when the second signal condition is present at the input thereto;

said circuit means is operable to bias the second transistor to a low conducting condition when the first transistor is in the substantially non-conducting condition; and said first transistor means is operable to bias the second transistor to a high conducting condition when the first transistor is in the high conducting condition.

6. A logic circuit including in combination:

input circuit means having a first operating condition and a second operating condition;

first, second, and third resistances connected in series between first and second sources of reference potential;

output transistor means having a pair of output terminals connected across the second and third resistances and having an input connection connected to the juncture between the second and third resistances, current flow between the sources of reference potential through the resistances tending to bias the output transistor means to a first operating condition; and coupling transistor means connected across the second resistance and having an input connection to said input circuit means, said coupling transistor means being operable to bias the output transistor means to a second operating condition when the input circuit means is in the second operating condition.

7. A logic circuit in accordance with claim 6 wherein:

said coupling transistor means includes a coupling transistor having its base connected to the input circuit means, its emitter connected to the juncture between the second and third resistances, and its collector connected to the juncture between the first and second resistances; and said output transistor means includes an output transistor having its base connected to the juncture between the second and third resistances, its emitter connected to the second source of reference potential, and its collector connected to the juncture between the first and second resistances.

8. A logic circuit in accordance with claim 7 wherein:

said input circuit means includes a multiple-emitter input transistor having its base connected through an input resistance to the first source of reference potential, its collector connected to the base of said coupling transistor, and its emitters connected to input terminals.

9. A logic circuit in accordance with claim 8 wherein:

said input transistor is biased to the first operating condition during the presence of a signal condition at at least one of the emitters of the input transistor forward biasing the base-emitter junction of the input transistor and causing heavy current flow through said input resistance whereby the potential at the base of the input transistor prevents current flow from the collector of the input transistor to the base of the coupling transistor thereby biasing the coupling transistor to a substantially non-conducting condition, and said input transistor being biased to the second operating condition during the presence of signal conditions at all of the emitters of the input transistor reverse biasing the base-emitter junctions of the input transistor and causing light current flow through said input resistance whereby the potential at the base of the input transistor causes current flow from the collector of the input transistor to the base of the coupling transistor thereby biasing the coupling transistor to a high conducting condition;

current flow between the sources of reference potential through the first, second, and third resistances tends to bias the output transistor to a low conducting condition; and said output transistor is biased to a high conducting condition when the coupling transistor is in a high conducting condition.

References Cited

UNITED STATES PATENTS

| | | | |
|---|---|---|---|
| 3,229,119 | 1/1966 | Bohn et al. | 307—215 XR |
| 3,390,280 | 6/1968 | Thompson | 307—218 XR |

FOREIGN PATENTS

| | | |
|---|---|---|
| 896,704 | 5/1962 | Great Britain. |

STANLEY T. KRAWCZEWICZ, Primary Examiner

U.S. Cl. X.R.

207—299